(12) United States Patent
Wu et al.

(10) Patent No.: US 7,639,478 B2
(45) Date of Patent: Dec. 29, 2009

(54) MEDIA PLAYING DEVICE

(75) Inventors: Zhi-Liang Wu, Shenzhen (CN);
Kun-Chih Hsieh, Taipei Hsien (TW);
Wen-Hsing Lin, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd,., Tu-Cheng, Taipei Hsien (TW)

( * ) Notice: Subject to any disclaimer, the term of this patent is extended or adjusted under 35 U.S.C. 154(b) by 17 days.

(21) Appl. No.: 12/135,995

(22) Filed: Jun. 9, 2008

(65) Prior Publication Data

US 2008/0310087 A1    Dec. 18, 2008

(30) Foreign Application Priority Data

Jun. 13, 2007   (CN) .................... 2007 1 0074952

(51) Int. Cl.
H05K 5/00 (2006.01)
G09G 5/00 (2006.01)
H04R 25/00 (2006.01)

(52) U.S. Cl. .............................. 361/679.01; 361/679.3; 345/156; 381/182; 463/46; 312/223.2

(58) Field of Classification Search ................. 345/156, 345/157, 168, 169; 361/679.01–679.45, 361/679.55–679.58, 724–727; 248/917–924; 381/182; 455/575.8

See application file for complete search history.

(56) References Cited

U.S. PATENT DOCUMENTS

2007/0060017 A1\* 3/2007 Klusmeyer et al. .......... 446/397
2008/0165997 A1\* 7/2008 Skurdal et al. .............. 381/334

\* cited by examiner

*Primary Examiner*—Jayprakash N Gandhi
*Assistant Examiner*—Nidhi Desai
(74) *Attorney, Agent, or Firm*—Zhigang Ma

(57) ABSTRACT

A media playing device is provided. In an exemplary form, the media playing device includes a housing having a cylindrical end with an opening. The media playing device also includes a hollow turning knob. The knob has two protrusions on its inside surface. The media playing device additionally includes a PCB disposed inside the housing with a micro controller unit (MCU) and a pair of switches. The medial playing device further includes an attachment means for attaching the knob to the cylindrical end of the housing and allowing the knob to rotate with respect to the cylindrical end. When the knob is rotated in clockwise direction or counter-clockwise direction, one of the two protrusions moves within the opening and can be moved to a position to contact one of the two switches to activate the switch. The activated switch sends a signal to the MCU and the MCU execute an operation.

5 Claims, 9 Drawing Sheets

MEDIA PLAYING DEVICE

BACKGROUND

1. Technical Field

The present invention relates to media playing devices, especially to a media playing device having a rotatable control knob.

2. General Background

FIG. 9 shows a conventional music player 1, the conventional music player 1 has an LCD 11 and a 5 way navigation button 12. The 5 way navigation button 12 is provided for being pushed up, down, left, right, and in, to operate the conventional music player 1.

Although having many advantages, the navigation button 12 has disadvantages too. In some cases, the navigation button 12 is too sensitive and responds to unintentional light touches to result in unintended operations being executed. Users have to take time to get accustomed to the 5 way navigation button 12. Another problem with the 5 way navigation button 12 is that it is sometimes a little difficult to press it in. Users need to press hard to force the navigation button 12 with their thumbs, which may result in injury to the user or damage to the button 12.

Accordingly, there is a need to provide an easily operated media playing device.

SUMMARY

A media playing device is provided. In an exemplary form, the media playing device includes a housing having a cylindrical end with an opening. The media playing device also includes a hollow turning knob. The knob has two protrusions on its inside surface. The media playing device additionally includes a printed circuit board (PCB) disposed inside the housing with a micro controller unit (MCU) and a pair of switches. The medial playing device further includes an attachment means for attaching the knob to the cylindrical end of the housing and allowing the knob to rotate with respect to the cylindrical end. When the knob is rotated in a clockwise direction or counterclockwise direction, one of the two protrusions moves within the opening and can be moved to a position to contact one of the two switches to activate the switch. The activated switch sends a signal to the MCU and the MCU executes an operation.

Other novel features and advantages will be drawn from the following detailed description with reference to the attached drawings.

BRIEF DESCRIPTION OF THE DRAWINGS

The components of the drawings are not necessarily drawn to measuring scale, the emphasis instead being placed upon clearly illustrating the principles of the media playing device. Moreover, in the drawings, like reference numerals designate corresponding parts throughout the several views.

DETAILED DESCRIPTION OF EMBODIMENTS

Figure 1:
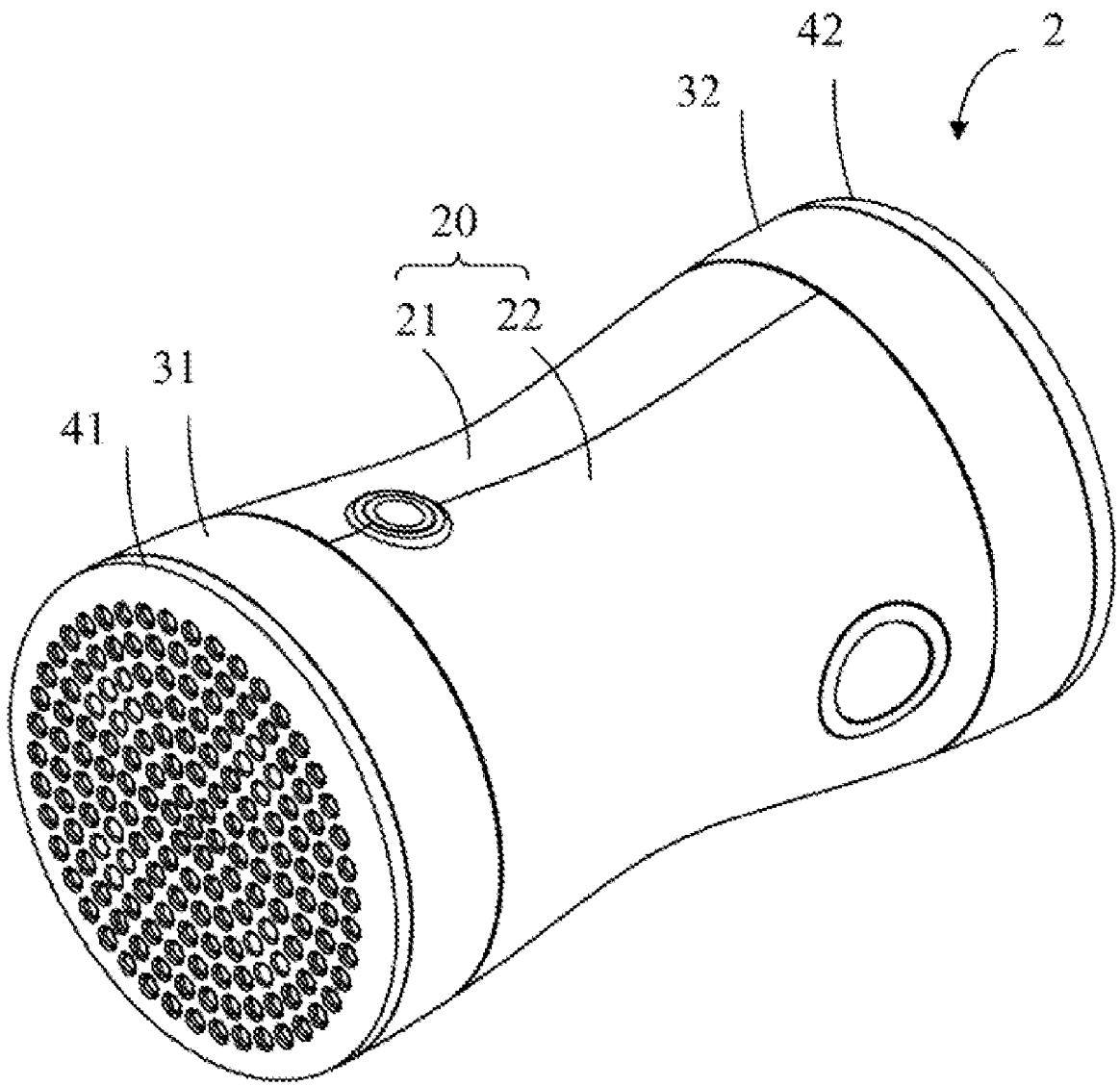
FIG. 1 is an isometric view of a media playing device in accordance with one embodiment of the present invention.

Referring to FIG. 1, a media playing device 2 has a casing 20 with a sandglass figure. The casing 20 includes two half casings 21 and 22 which are coupled together to form the casing 20.

Two turning knobs 31 and 32 are located at each end portion of the casing 20. The turning knobs 31 and 32 can be turned to rotate around the end portions of the casing 20. A first side cover 41 and a second side cover 42 are detachably coupled to the casing 20 at respective end portions of the casing 20.

Figure 2:
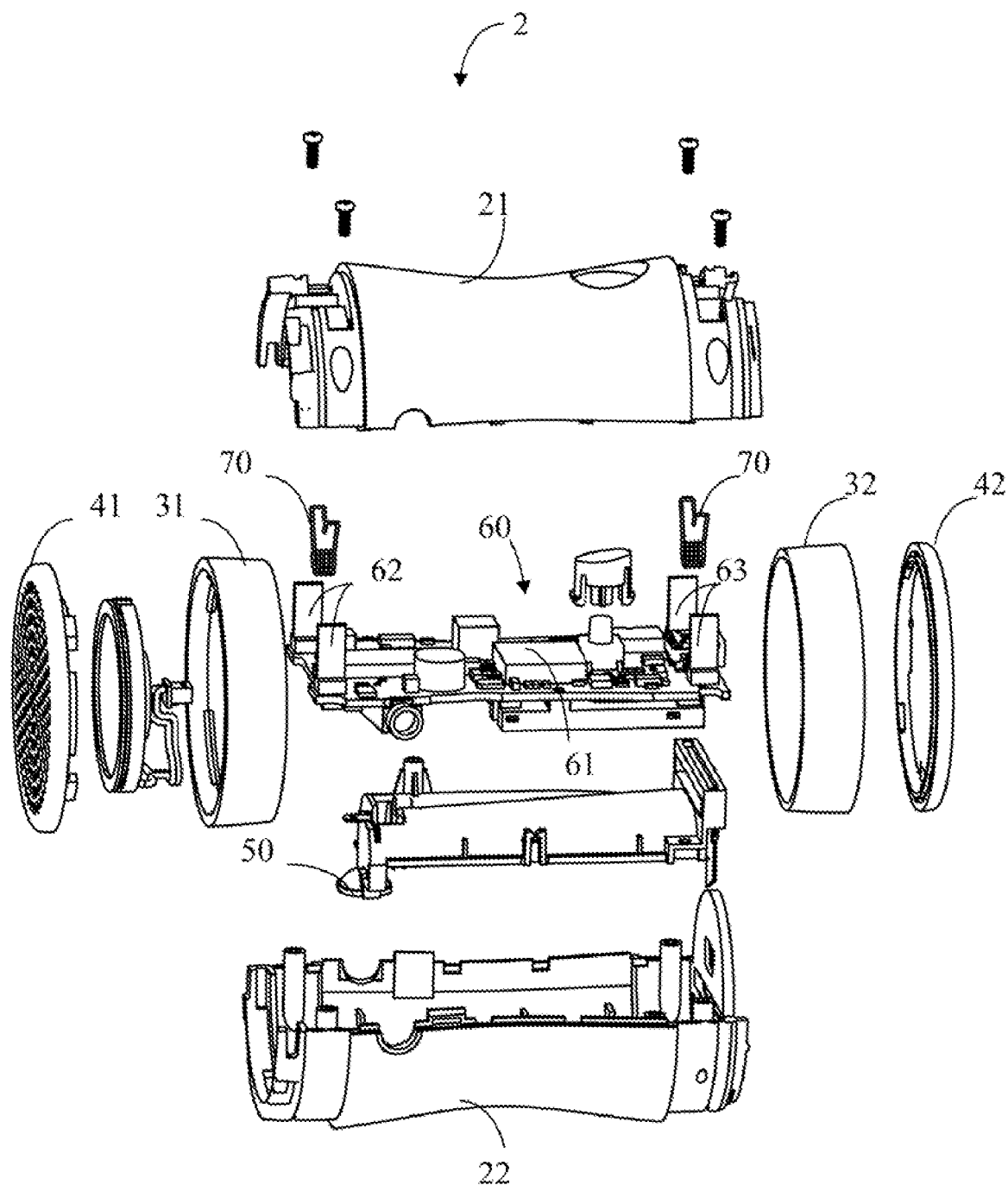
FIG. 2 is an exploded view of the media playing device of FIG. 1.

Referring to FIG. 2, a battery accommodating means 50, a print circuit board (PCB) 60, and two torsion springs 70 are disposed within the casing 20. The battery accommodating means 50 is secured to the half casing 22 and is configured for receiving a battery to supply power to the media playing device 2. The PCB 60 is secured to the battery accommodating means 50.

Figure 3:
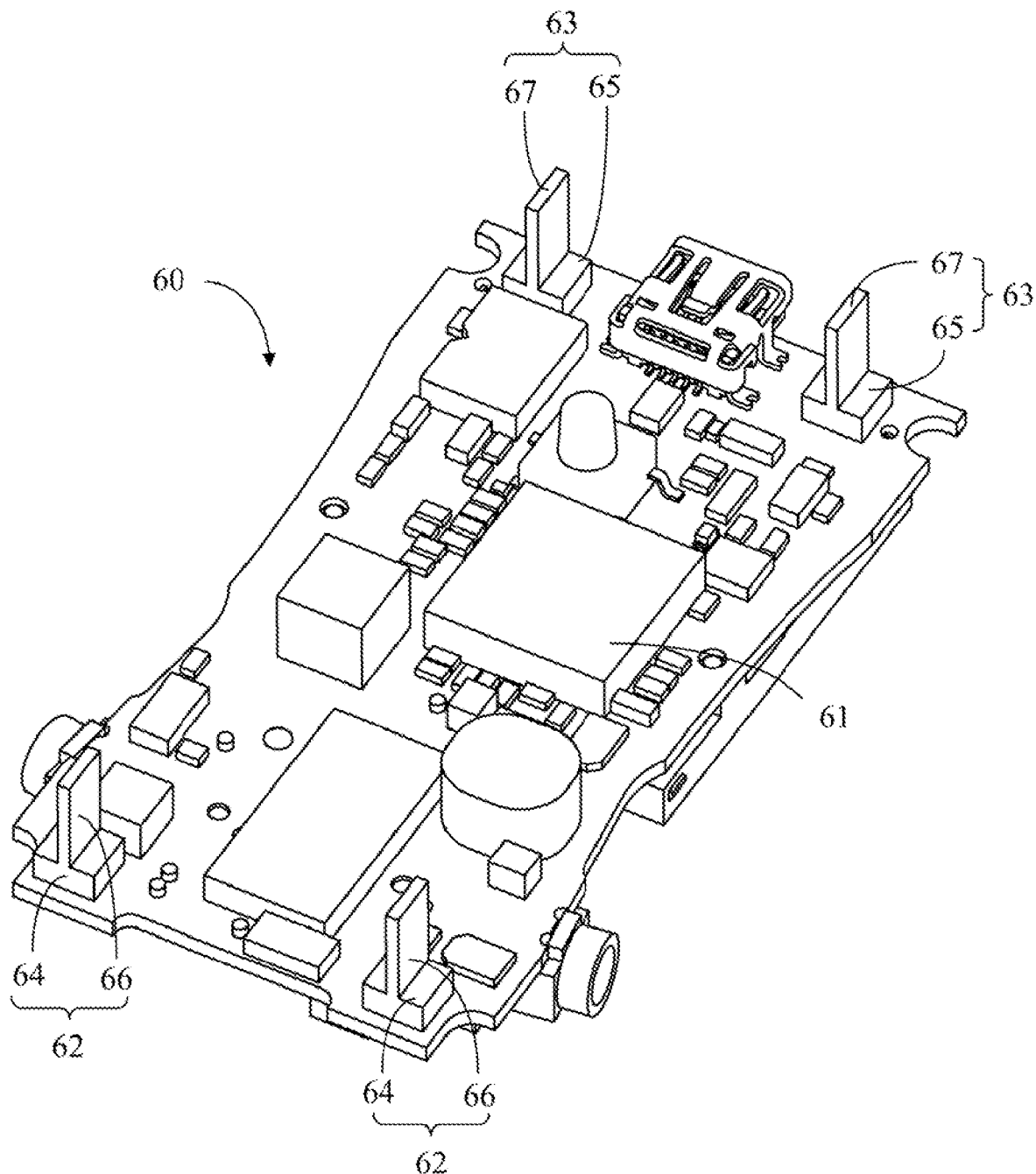
FIG. 3 is an isometric view of a PCB of the media playing device of FIG. 2.

Referring to FIG. 3, the PCB 60 includes a micro controller unit (MCU) 61 and two pairs of switches 62 and 63. The switches 62 and 63 include bases 64 and 65, and long thin tabs 66 and 67 extending from the bases 64, 65. Each pair of the switches 62 and 63 are located at respective corners of the oblong PCB 60 and are configured for being activated to send signals to the MCU 61.

Figure 4:
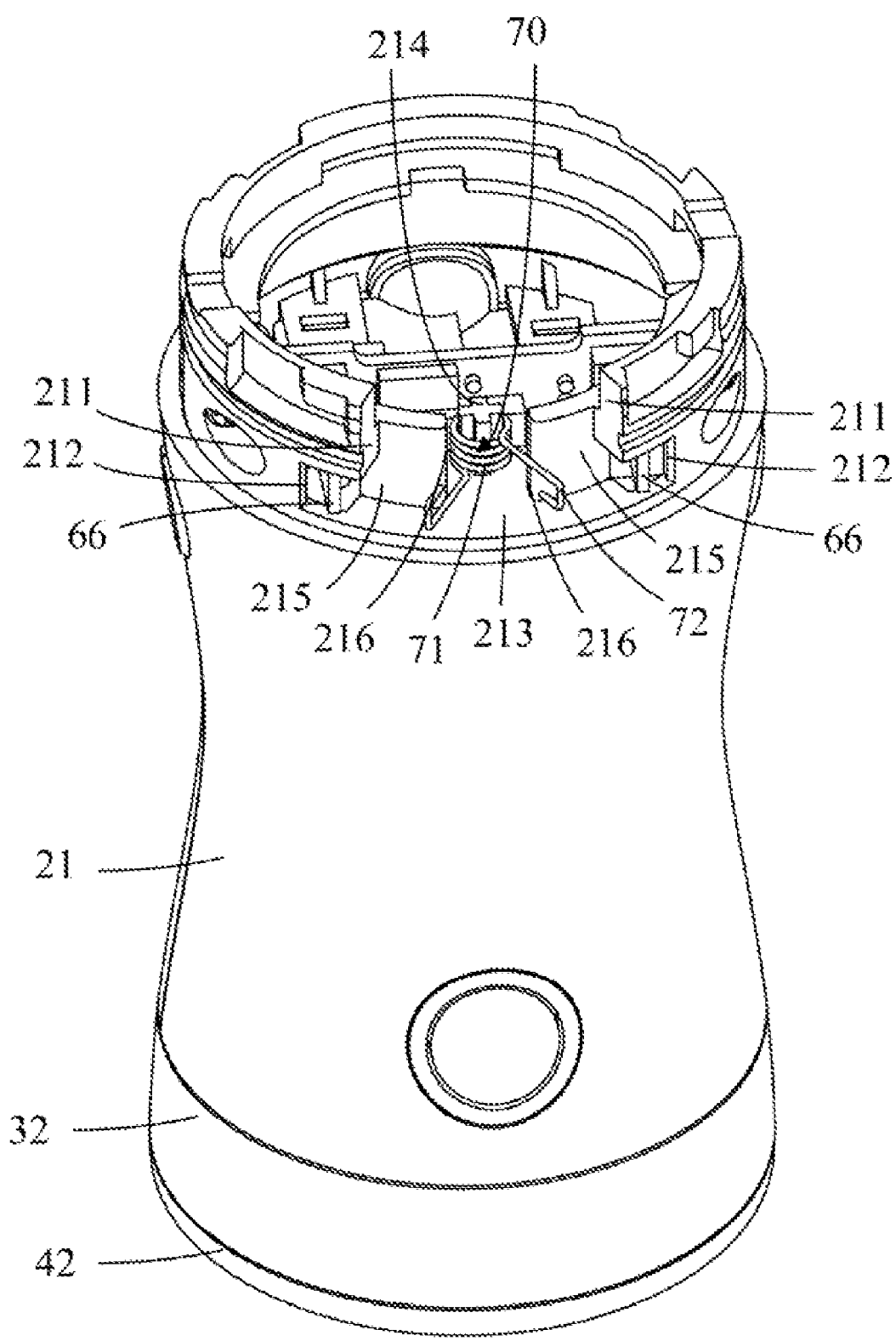
FIG. 4 is an isometric view of the media playing device of FIG. 1 with a first side cover and a corresponding turning knob omitted.
Figure 5:
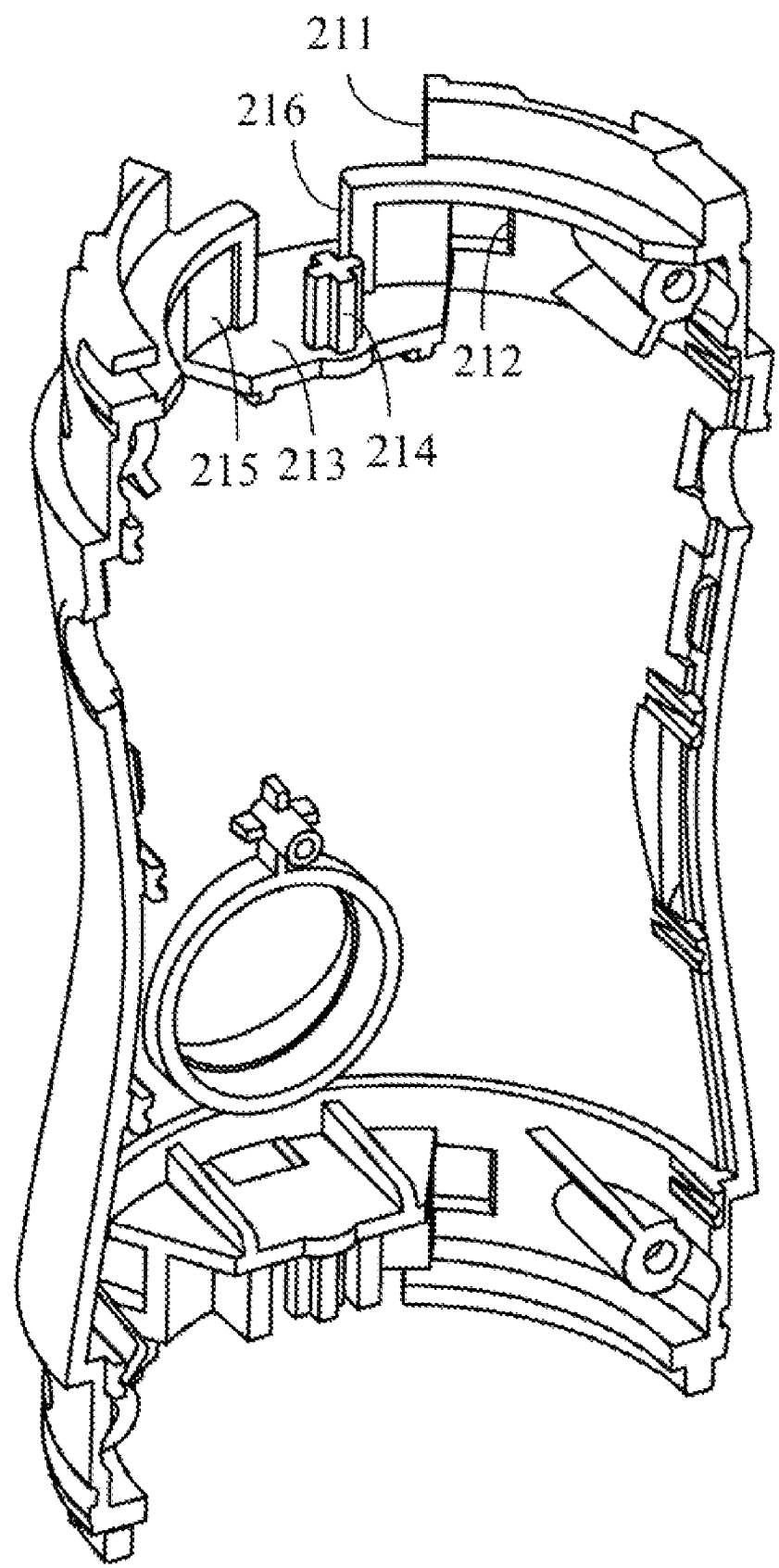
FIG. 5 is an isometric view of a half casing of the media playing device of FIG. 1.

Referring to FIGS. 4 and 5, the torsion spring 70 is secured on the half casing 21 and is configured for returning the turning knobs 31 and 32 to their original positions after their being rotated.

The half casing 21 has an opening 211 in a lip of the half casing 21. The half casing 21 also has a slot 212 extending circumferentially below the opening 211. The opening 211 communicates with the slot 212 and the width of the opening 211 is smaller than that of the slot 212, thus forming an upside down T type opening.

A planar portion 213 with a post 214 and a wall 215 extends radially inwardly from a bottom rim of the slot 212. The wall 215, which is located inside the half casing 21, extends axially from the planar portion 213 and has a cutout 216. The post 214, which extends axially from the planar portion 213, is located inward of the wall 215 near, and aligned with, the cutout 216. The distal ends of the tabs 66 of the switches 62 disposed in the PCB 60 are exposed at the two ends of the slot 212 respectively (see FIG. 4).

The torsion spring 70 includes a coiled portion 71 and two legs 72. The torsion spring 70 is secured to the half casing 21 with the coiled portion 71 engaging with the post 214 and the spring legs 72 being clamped by the cutout 216, thus the torsion spring 70 is slightly compressed.

Figure 6:
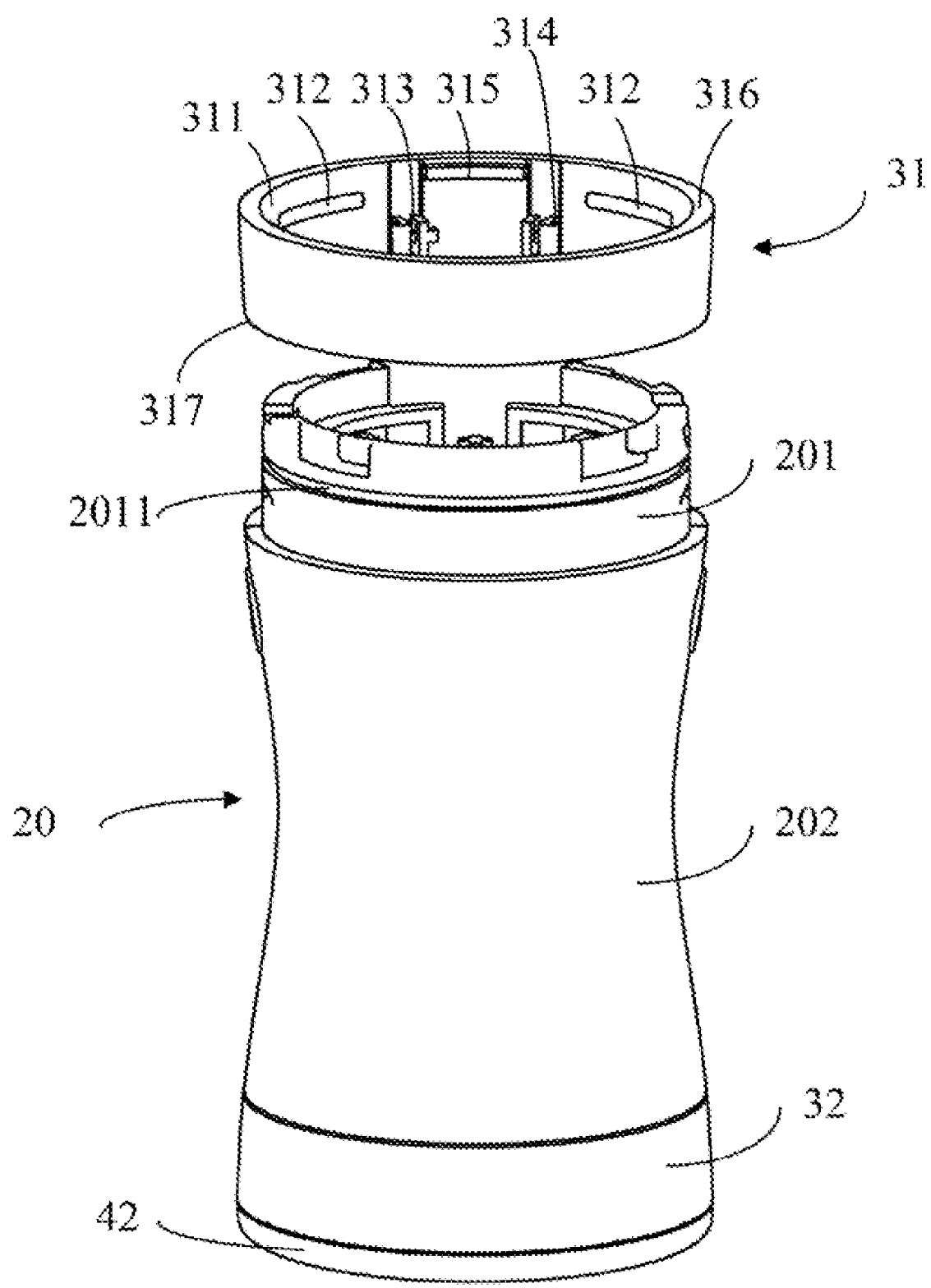
FIG. 6 is an partially exploded view of the media playing device of FIG. 1.
Figure 7:
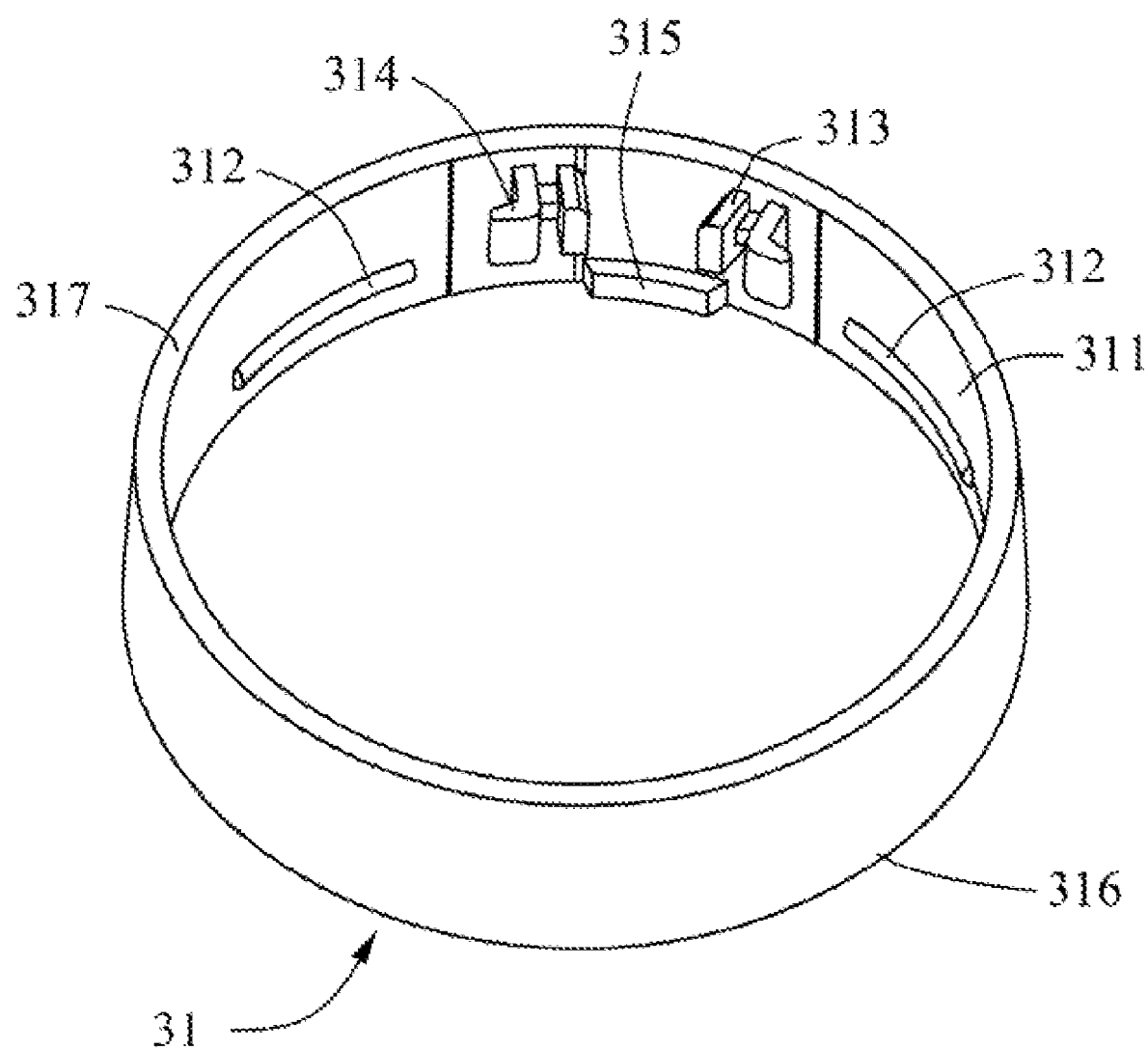
FIG. 7 is an isometric view of a turning knob of the media playing device of FIG. 1.

Referring to FIGS. 6 and 7, the casing 20 has a cylindrical end portion 201 and a middle portion 202. The end portion 201 has a reduced diameter relative to the middle portion 202, thus after the turning knob 31 is attached to the end portion 201, the outside surface of the turning knob 31 and the outside surface of the middle portion 202 join together smoothly. The end portion 201 has an annular groove 2011 extending circumferentially on the outside surface of the end portion 201.

The thin-wall turning knob 31 is hollow and includes a cylindrical inside surface 311 which includes three circumferential protrusions 312 (one not shown), two spaced contacting protrusions 313 and 314, and a protecting tab 315. The turning knob also has an upper end 316 and a bottom end 317. The spaced contacting protrusions 313 and 314 are disposed near the bottom end 317. The protecting tab 315 is disposed near the upper end 316.

Figure 8:
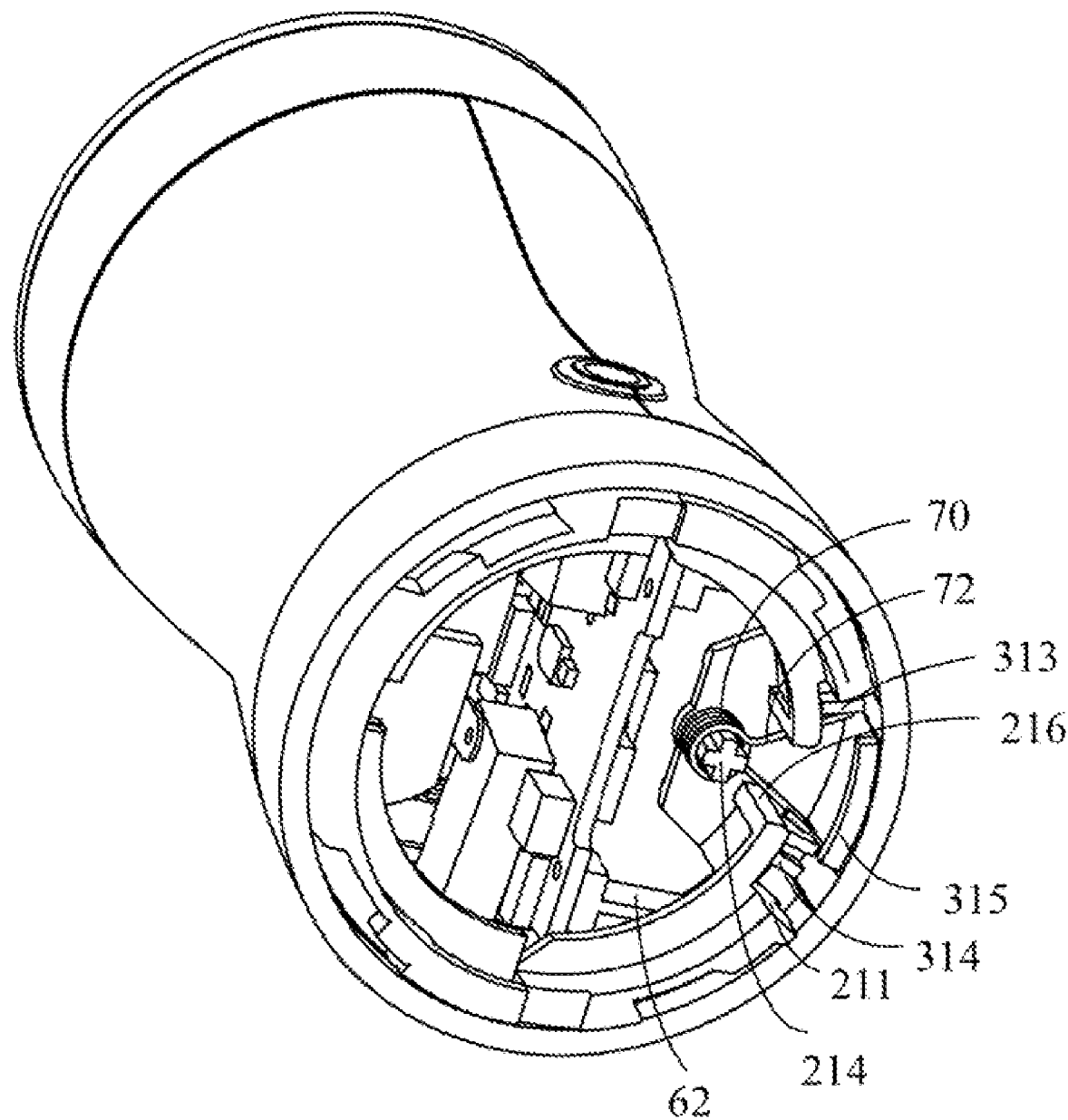
FIG. 8 is an isometric view, showing from a first side of the media playing device of FIG. 1 with the first side cover omitted.
Figure 9:
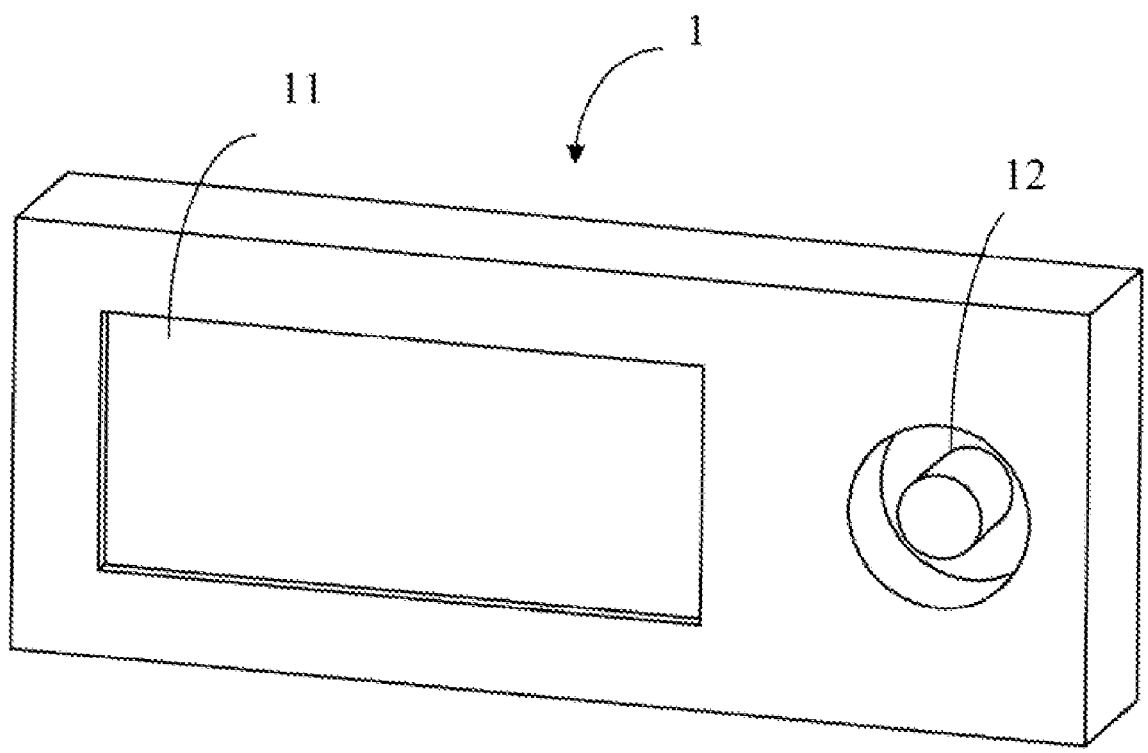
FIG. 9 is an isometric view of a conventional music player.

Referring to FIG. 8, when attaching the turning knob 31 to the casing 20, the inside surface 311 of the turning knob 31 is mated with the outside surface of the end portion 201 of the casing 20, thus the turning knob 31 can be slid axially onto the end portion 201 until that the circumferential protrusions 312 are fully received in the annular groove 2011.

The inside surface 311 and the outside surface of the end portion 201 have approximately a same-size diameter, and thus the end portion 201 and the turning knob 31 are slightly elastically deformed in the process of sliding the turning knob 31 onto the end portion 201. After the circumferential protrusions 312 are received in the annular groove 2011, the elastic deformation of the end portion 201 ceases. The axial width of the annular groove 2011 is a little greater than that of the circumferential protrusions 312, thus allowing the turning knob 31 to rotate with respect to the end portion 201 and limit the axial movement of the turning knob 31.

After the turning knob 31 is attached to the casing 20, the protecting tab 315 is located within the opening 211 and the contacting protrusions 313 and 314 are located within the slot 212 and press against distal ends of the two legs 72 of the torsion spring 70.

The turning knob 31 can be rotated in a clockwise or counterclockwise direction to control the media playing device 2. When the turning knob 31 is rotated in the clockwise direction, for example, the contacting protrusion 313 pushes the spring leg 72 to move in the slot 212 with the rotation of the turning knob 31. After the turning knob 31 is rotated to a position where the contacting protrusion 313 contacts the switch 62, a signal is generated by the switch 62 and is sent to the MCU 61. The MCU 61 thus executes an operation, such as adjusting a volume of the media playing device 2.

The protecting tab 315 moves with the rotation of the turning knob 31 and cooperates with the side surface of the opening 211 to stop the rotation of the turning knob 31. That is, after the contacting protrusion 313 or 314 contacts the switch 62, further rotation of the turning knob 31 is stopped when the protecting tab 315 contacts against one of the side surface of the opening 211, thereby preventing the switch 62 from being deformed so much as to be damaged.

The turning knob 32 is attached to the casing 20 in the same way as the turning knob 31 is attached to the casing 20. The second side cover 42 is attached to the casing 20 in the same way as the first side cover 41 is attached to the casing 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A media playing device comprising:
   a hollow turning knob with a cylindrical inside surface having two spaced contacting protrusions extending radially inwardly therefrom;
   a housing including a cylindrical end portion having an opening in a lip thereof, the opening providing space for accommodating the contacting protrusions;
   a PCB disposed within the housing, the PCB having a micro controller unit and two switches having distal ends being exposed through the opening, the switches being contacted to be activated to send a signal to the micro controller unit, the micro controller unit executing an operation in response to the signal;
   attachment means on an outside surface of the end portion and the cylindrical inside surface configured for attaching the hollow turning knob to the housing and allowing a relative rotational movement between the hollow turning knob and the housing;
   wherein the media playing device further comprises a torsion spring, the housing has a spring attachment means for attaching the torsion spring to the housing and defining a range in which two legs of the torsion spring move; wherein, when the torsion spring is attached to the housing, ends of the two legs of the torsion spring contact the two contacting protrusions when the torsion spring is in a compression state; and
   wherein the spring attachment means comprises a wall and a post, the wall and the post extend axially from a planar portion adjacent the opening, the planar portion extends radially inwardly from the inside surface of the housing, the post is configured for retaining the coiled portion of the torsion spring, the wall has a cutout whose two rims are configured for clamping the two legs of the torsion spring.

2. The media playing device according to claim 1, wherein the attachment means comprises an annular groove around the outside surface of the end portion and a circumferential protrusion extending from the inside surface of the knob, wherein the circumferential protrusion is configured for engaging with annular groove.

3. The media playing device according to claim 1, wherein the hollow turning knob includes a protecting tab, the protecting tab is disposed within the opening of the hollow housing after the hollow turning knob is attached to the housing, and cooperates with the opening to stop rotating of the hollow turning knob after one of the switches is activated.

4. The media playing according to claim 1, wherein the media playing device has a sandglass shape.

5. The media playing device according to claim 1, the opening of the cylindrical end portion is an upside down T type opening.

* * * * *